United States Patent
Chang et al.

(10) Patent No.: US 8,525,348 B2
(45) Date of Patent: Sep. 3, 2013

(54) CHIP SCALE PACKAGE AND FABRICATION METHOD THEREOF

(75) Inventors: Chiang-Cheng Chang, Taichung (TW); Chun-Chi Ke, Taichung (TW); Chien-Ping Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 333 days.

(21) Appl. No.: 12/971,797

(22) Filed: Dec. 17, 2010

(65) Prior Publication Data

US 2012/0032347 A1 Feb. 9, 2012

(30) Foreign Application Priority Data

Aug. 4, 2010 (TW) ................................ 99125877 A

(51) Int. Cl.
*H01L 23/48* (2006.01)

(52) U.S. Cl.
USPC .................. 257/777; 438/109; 257/E27.137; 257/E27.144; 257/E27.161

(58) Field of Classification Search
USPC ................. 438/106–109; 257/659, 660, 777, 257/E23.144, E23.123, E27.137, E27.144, 257/E27.161
See application file for complete search history.

(56) References Cited

U.S. PATENT DOCUMENTS

| 5,892,179 | A | 4/1999 | Rinne et al. | |
|---|---|---|---|---|
| 6,103,552 | A | 8/2000 | Lin | |
| 6,124,637 | A * | 9/2000 | Freyman et al. | 257/736 |
| 6,271,469 | B1 | 8/2001 | Ma et al. | |
| 6,287,893 | B1 | 9/2001 | Elenius et al. | |
| 6,350,668 | B1 | 2/2002 | Chakravorty | |
| 6,433,427 | B1 | 8/2002 | Wu et al. | |
| 6,498,387 | B1 | 12/2002 | Yang | |
| 6,586,822 | B1 | 7/2003 | Vu et al. | |
| 7,019,406 | B2 | 3/2006 | Huang et al. | |
| 7,238,602 | B2 | 7/2007 | Yang | |
| 2006/0087036 | A1 * | 4/2006 | Yang | 257/738 |
| 2011/0147901 | A1 * | 6/2011 | Huang et al. | 257/660 |
| 2011/0156237 | A1 * | 6/2011 | Gulpen et al. | 257/692 |

* cited by examiner

*Primary Examiner* — Brook Kebede
(74) *Attorney, Agent, or Firm* — Edwards Wildman Palmer LLP; Peter F. Corless; Steven M. Jensen

(57) ABSTRACT

A fabrication method of a chip scale package includes providing electronic components, each having an active surface with electrode pads and an opposite inactive surface, and a hard board with a soft layer disposed thereon; adhering the electronic components to the soft layer via the inactive surfaces thereof; pressing the electronic components such that the soft layer encapsulates the electronic components while exposing the active surfaces thereof; forming a dielectric layer on the active surfaces of the electronic components and the soft layer; and forming a first wiring layer on the dielectric layer and electrically connected to the electrode pads, thereby solving the conventional problems caused by directly attaching a chip on an adhesive film, such as film-softening, encapsulant overflow, warpage, chip deviation and contamination that lead to poor electrical connection between the electrode pads and the wiring layer formed in a subsequent RDL process and even waste product.

19 Claims, 7 Drawing Sheets

CHIP SCALE PACKAGE AND FABRICATION METHOD THEREOF

CROSS-REFERENCES TO RELATED APPLICATIONS

This application claims under 35 U.S.C §119(a) the benefit of Taiwanese Application Nos. 099125877, filed Aug. 4, 2010, the entire contents of which is incorporated herein by reference.

BACKGROUND OF THE INVENTION

1. Field of the Invention

The present invention relates generally to semiconductor packages and fabrication methods thereof, and more particularly, to a chip scale package and a fabrication method thereof.

2. Description of Related Art

A chip scale package (CSP) is characterized in that the package size is equivalent to the size of the chip that is disposed in the package. U.S. Pat. Nos. 5,892,179, 6,103,552, 6,287,893, 6,350,668 and 6,433,427 disclose a conventional CSP structure, wherein a build-up structure is directly formed on a chip without using a chip carrier, such as a substrate or a lead frame, and a redistribution layer (RDL) technique is used to accomplish a redistribution of the electrode pads of the chip to a desired pattern.

However, the application of the RDL technique or disposing of conductive traces on the chip is limited by the size of the chip or the area of the active surface of the chip. Particularly, as chips are developed towards high integration and compact size, they do not have enough surface area for mounting of more solder balls for electrical connection to an external device.

Accordingly, U.S. Pat. No. 6,271,469 provides a fabrication method of a wafer level chip scale package (WLCSP), wherein a build-up layer is formed on the chip of the package so as to provide enough surface area for disposing I/O terminals or solder balls.

Referring to FIG. 1A, an adhesive film 11 is prepared, and a plurality of chips 12, each having an active surface 121 and an opposite inactive surface 122, is provided and attached to the adhesive film 11 via the active surfaces 121 thereof, respectively. Therein, the adhesive film 11 can be such as a heat-sensitive adhesive film. Referring to FIG. 1B, a molding process is performed to form an encapsulant 13 such as an epoxy resin encapsulating the inactive surfaces 122 and side surfaces of the chips 12. Then, the adhesive film 11 is removed by heating so as to expose the active surfaces 121 of the chips 12. Referring to FIG. 1C, by using an RDL technique, a dielectric layer 14 is formed on the active surfaces 121 of the chips 12 and the surface of the encapsulant 13 and a plurality of openings is formed in the dielectric layer 14 to expose the electrode pads 120 of the chips. Then, a wiring layer 15 is formed on the dielectric layer 14 and electrically connected to the electrode pads 120. A solder mask layer 16 with a plurality of openings is further formed on the wiring layer 15, and solder balls 17 are mounted on the wiring layer 15 in the openings of the solder mask layer 16. Subsequently, a singulation process is performed to obtain a plurality of packages.

In the above-described packages, the surface of the encapsulant encapsulating the chip is larger than the active surface of the chip and therefore allows more solder balls to be mounted thereon for electrically connecting to an external device.

However, since the chip is fixed by being attached to the adhesive film, deviation of the chip can easily occur due to film-softening and extension caused by heat, especially in the molding process, thus adversely affecting the electrical connection between the electrode pads of the chip and the wiring layer during the subsequent RDL process. Further, the use of the adhesive film leads to increase of the fabrication cost.

Referring to FIG. 2, since the adhesive film 11 is softened by heat in the molding process, overflow 130 of the encapsulant 13 can easily occur to the active surface 121 of the chip 12 and even contaminate the electrode pads 120 of the chip 12, thus resulting in poor electrical connection between the electrode pads of the chip and subsequently formed wiring layer and even causing product failure.

Referring to FIG. 3A, since the adhesive film 11 supports a plurality of chips 12, warpage 110 can easily occur to the adhesive film 11 and the encapsulant 13, especially when the encapsulant 13 has a small thickness. As such, the thickness of the dielectric layer formed on the chip during the RDL process is not uniform. To overcome this drawback, a hard carrier 18 as shown in FIG. 3B is required so as for the encapsulant 13 to be secured thereto through an adhesive 19, which however complicates the process and increases the fabrication cost. Further, when the RDL process is completed and the hard carrier 18 is removed, some adhesive residue 190 may be left on the encapsulant, as shown in FIG. 3C. Related techniques are disclosed in U.S. Pat. Nos. 6,498,387, 6,586,822, 7,019,406 and 7,238,602.

Therefore, it is imperative to provide a chip scale package and a fabrication method thereof so as to ensure the electrical connection quality between the chip electrode pads and the wiring layer of the package, improve the product reliability and reduce the fabrication cost.

SUMMARY OF THE INVENTION

In view of the above-described drawbacks, the present invention provides a fabrication method of a chip scale package, which comprises the steps of: providing a plurality of electronic components, each having an active surface with a plurality of electrode pads and an inactive surface opposite to the active surface, and a hard board with a soft layer disposed thereon, and adhering the electronic components to the soft layer via the inactive surfaces thereof; pressing the electronic components such that the soft layer encapsulates the electronic components while exposing the active surfaces of the electronic components; forming a dielectric layer on the active surfaces of the electronic components and the soft layer, and forming a plurality of openings in the dielectric layer for exposing the electrode pads, respectively; and forming a first wiring layer on the dielectric layer and electrically connecting the first wiring layer to the electrode pads.

Subsequently, a singulation process can be performed so as to obtain a plurality of wafer level chip scale packages (WLCSPs).

In the above-described method, the electronic components can be chips or passive components. A die attach film can be disposed on the inactive surfaces of the electronic components so as to allow the electronic components to be adhered to the soft layer.

The above-described method can further comprise forming a first solder mask layer on the dielectric layer and the first wiring layer and forming a plurality of openings in the first solder mask layer for exposing a certain portion of the first wiring layer. Furthermore, conductive elements such as solder balls or solder pins can be mounted to said certain portion of the first wiring layer.

In another embodiment, the method comprises forming at least a conductive through hole penetrating the hard board and the soft layer for electrically connecting the first wiring layer. In particular, after the step of forming the dielectric layer, at least a conductive through hole penetrating the hard board, the soft layer and the dielectric layer is formed to electrically connect the first wiring layer. Alternatively, after the step of forming the first wiring layer, at least a conductive through hole penetrating the hard board, the soft layer and the dielectric layer is formed to electrically connect the first wiring layer.

Thereafter, a second wiring layer is formed on the bottom surface of the hard board and electrically connected to the conductive through hole; and a second solder mask layer is formed on the bottom surface of the hard board and the second wiring layer and has a plurality of openings formed therein for exposing a certain portion of the second wiring layer.

Further, a build-up structure can be formed on the first wiring layer by using a redistribution layer (RDL) technique. The build-up structure can also be formed on the second wiring layer and the second solder mask layer.

The Young's modulus of the hard board is over five times that of the soft layer so as to avoid warpage of the package.

Through the above fabrication method, the present invention further discloses a chip scale package, which comprises: at least an electronic component having an active surface with a plurality of electrode pads and an inactive surface opposite to the active surface; a soft layer encapsulating the electronic component while exposing the active surface of the electronic component; a hard board disposed on the bottom surface of the soft layer; a dielectric layer disposed on the active surface of the electronic component and the soft layer and having a plurality of openings for exposing the electrode pads; and a first wiring layer disposed on the dielectric layer and electrically connected to the electrode pads.

The electronic component can be a chip or a passive component. The chip scale package can further comprise at least a conductive through hole penetrating the hard board, the soft layer and the dielectric layer for electrically connecting the first wiring layer. Furthermore, a second wiring layer can be disposed on the bottom surface of the hard board and electrically connected to the conductive through hole; and a second solder mask layer can be disposed on the bottom surface of the hard board and the second wiring layer and have a plurality of openings for exposing a certain portion of the second wiring layer.

The chip scale package can selectively comprise one or more electronic components. All the electronic components of the package can be chips, or some of them are chips and the others are passive components, and each of the electronic components has a die attach film disposed on the inactive surface thereof. The chip scale package can further comprise a first solder mask layer disposed on the dielectric layer and the first wiring layer and having a plurality of openings for exposing a certain portion of the first wiring layer. Alternatively, a build-up structure can be disposed on the first wiring layer by using an RDL technique. The build-up structure can also be disposed on the second wiring layer and the second solder mask layer.

The chip scale package can further comprise another semiconductor package stacked on said certain portion of the first wiring layer through conductive elements or stacked on said certain portion of the second wiring layer through conductive elements.

Therefore, the present invention mainly involves providing a hard board with a soft layer so as to encapsulate an electronic component with the soft layer while expose the active surface of the electronic component and then performing an RDL process, thereby eliminating the need of a molding process. The hard board can absorb heat stress in the fabrication process so as to avoid the conventional problems caused by directly attaching the electronic component on an adhesive film as in the prior art, such as film-softening caused by heat, electronic component deviation and contamination that lead to poor electrical connection between the wiring layer in a subsequent RDL process and the electrode pads and even waste product as a result. Further, the present invention eliminates the need of an adhesive film, thereby reducing the fabrication cost and avoiding warpage of the structure. Furthermore, by using a pressing system to make the soft layer encapsulate the electronic component, the electronic component can be secured at position so as not to deviate. In addition, by forming at least a conductive through hole in the hard board and the soft layer, the package can be stacked with other packages.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'first', 'second', 'up', 'down', 'bottom', 'inside' etc. are only used as a matter of descriptive convenience and not intended to have any other significance or provide limitations for the present invention.

First Embodiment

FIGS. 4A to 4E' are cross-sectional views showing a chip scale package and a fabrication method thereof according to a first embodiment of the present invention.

Figure 1A:
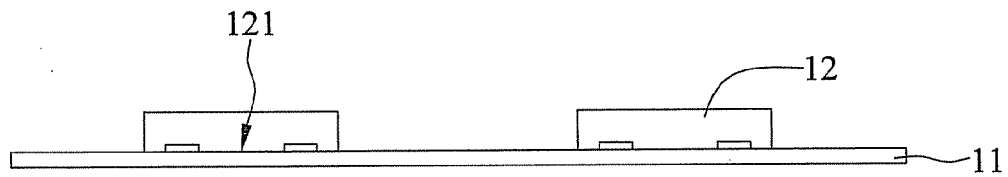
FIGS. 1A to 1C are cross-sectional views showing a fabrication method of a wafer level chip scale package according to U.S. Pat. No. 6,271,469.
Figure 1B:
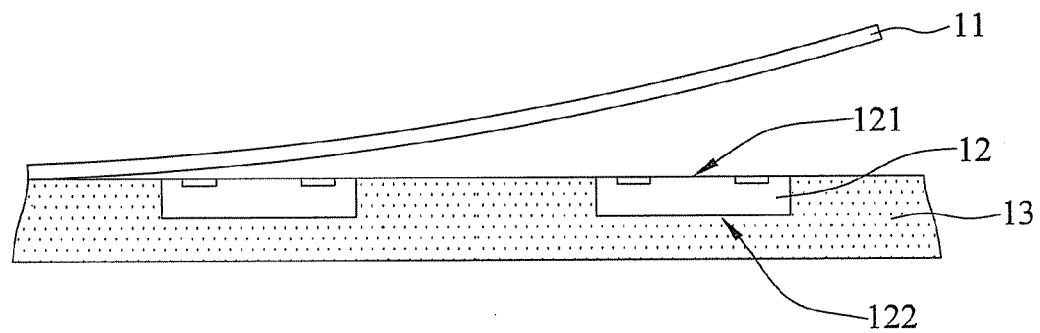
Figure 1C:
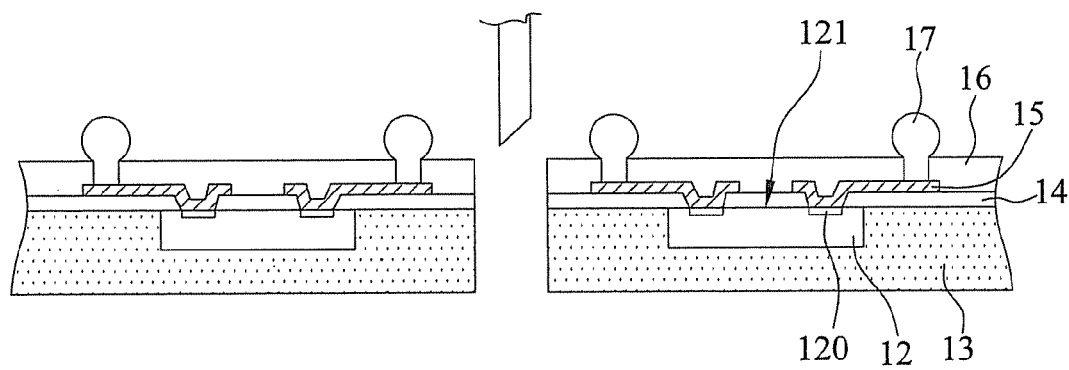
Figure 2:
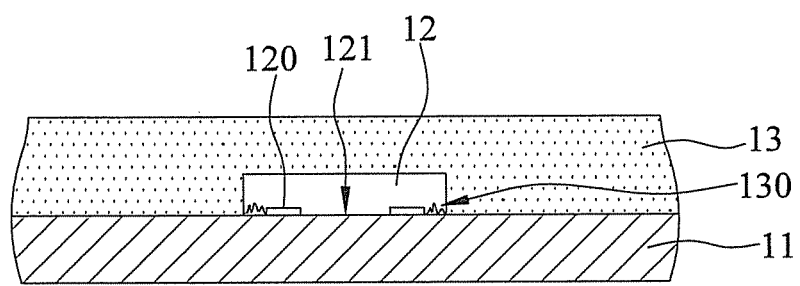
FIG. 2 is a cross-sectional view showing encapsulant overflow of the package.
Figure 3A:
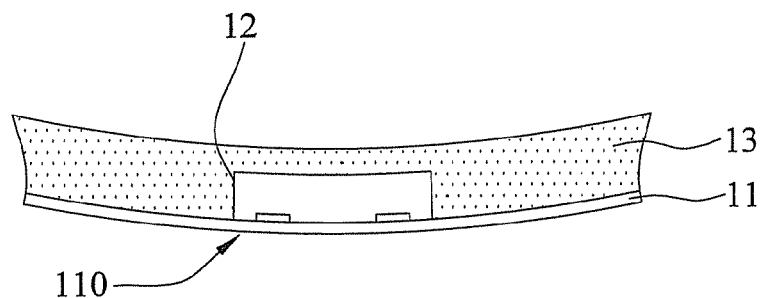
FIG. 3A is a cross-sectional view showing warpage of the package.
Figure 3B:
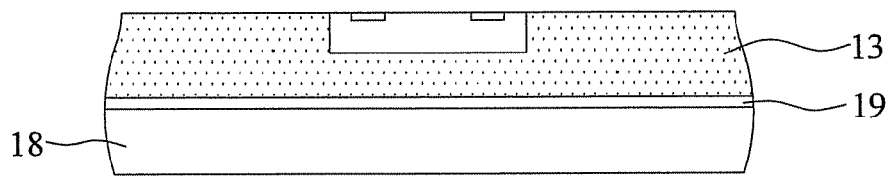
FIG. 3B is a cross-sectional view showing application of a hard carrier to the package.
Figure 3C:
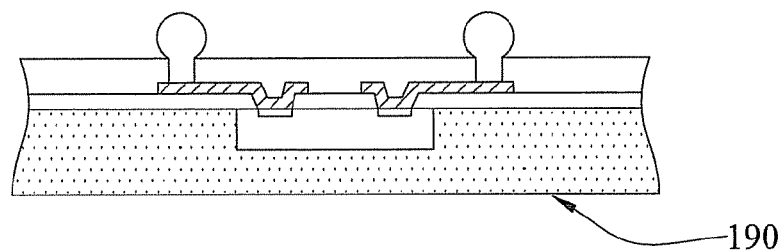
FIG. 3C is a cross-sectional view showing the problem of adhesive residue of the package.
Figure 4A:
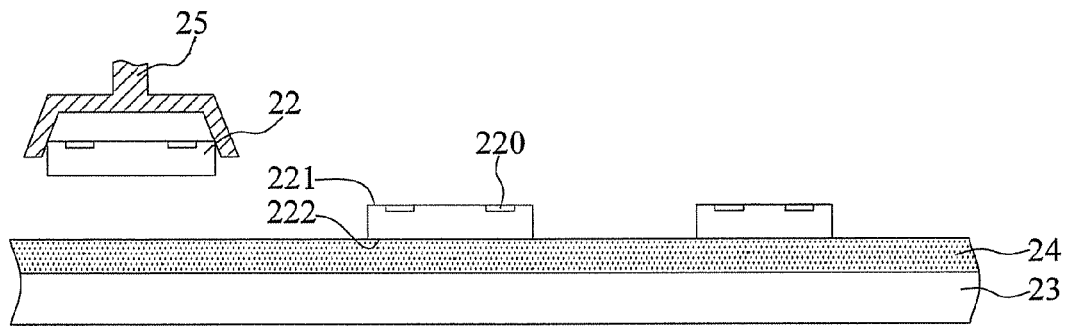
FIGS. 4A to 4E' are cross-sectional views showing a chip scale package and a fabrication method thereof according to a first embodiment of the present invention, wherein FIG. 4B' shows a press board with a back plate disposed on the bottom surface thereof and FIG. 4D' shows a package with a build-up structure.

Referring to FIG. 4A, a plurality of electronic components 22, each having an active surface 221 with a plurality of electrode pads 220 and an inactive surface 222 opposite to the active surface 221, and a hard board 23 with a soft layer 24 disposed thereon are provided. The electronic components 22 can be chips or passive components. The electronic components 22 are adhered to the soft layer 24 via the inactive surfaces 222 thereof by using a pick-up head 25. Each time one or more electronic components 22 can be adhered to the soft layer. The hard board 23 can be made of copper clad laminate (CCL), prepreg (PP), CCL and metal plate laminating board, or PP and metal plate laminating board, which can be peeled off or etched away in a subsequent process. The soft layer 24 can be made of a polymer material, such as ajinomoto build-up film (ABF) or polyimide (PI). The Young's modulus of the hard board 23 is preferably over five times that of the soft layer so as to avoid warpage of the package.

Figure 4B:
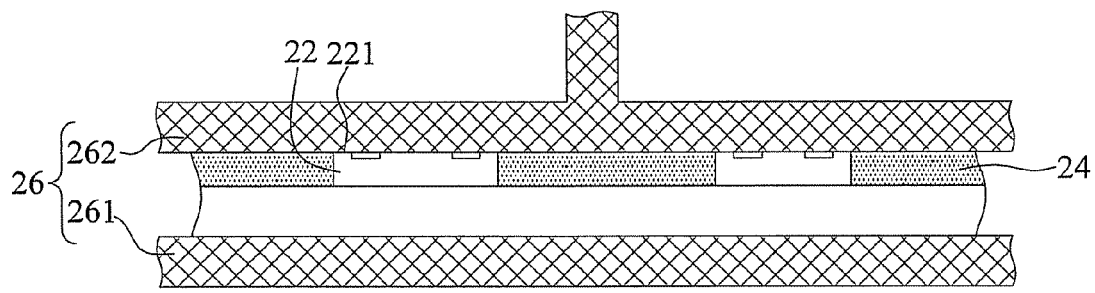
Figure 4B:
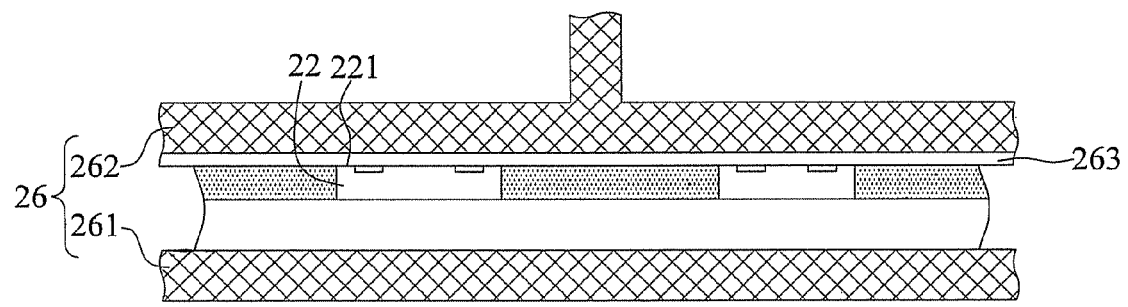

Referring to FIG. 4B, a pressing system 26 comprising a base 261 and a press board 262 is used to press the electronic components 22 so as to allow the soft layer to encapsulate the electronic components 22 while expose the active surfaces 221 of the electronic components 22. Referring to FIG. 4B', a back plate 263 is usually disposed on the bottom surface of the press board 262 for protecting the electronic components and preventing encapsulant overflow.

Figure 4C:
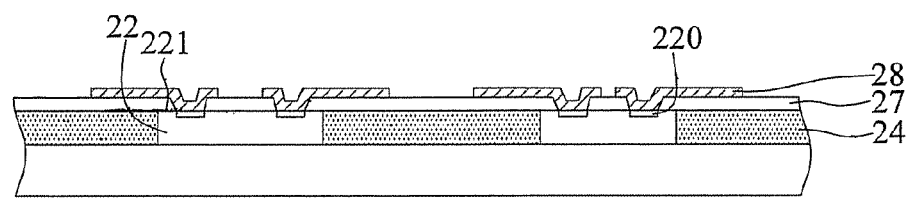

Referring to FIG. 4C, a dielectric layer 27 is formed on the active surfaces 221 of the electronic components 22 and the soft layer 24, and a plurality of openings is formed in the dielectric layer 27 through photolithography or laser so as to expose the electrode pads 220, respectively. The dielectric layer 27 functions as a seed layer that allows a subsequently formed wiring layer to be attached thereto. Then, by using an RDL technique, a first wiring layer 28 is formed on the dielectric layer 27 and electrically connected to the electrode pads 220.

Figure 4D:
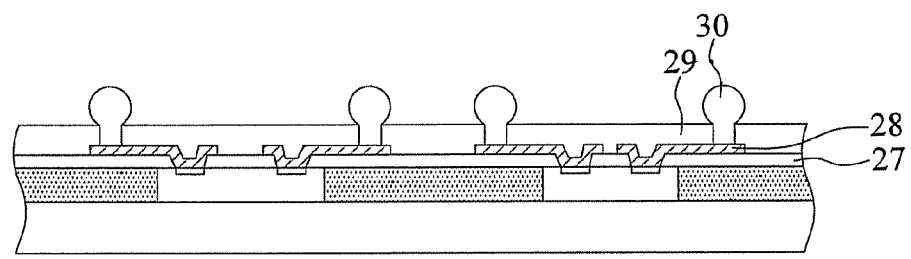
Figure 4D:
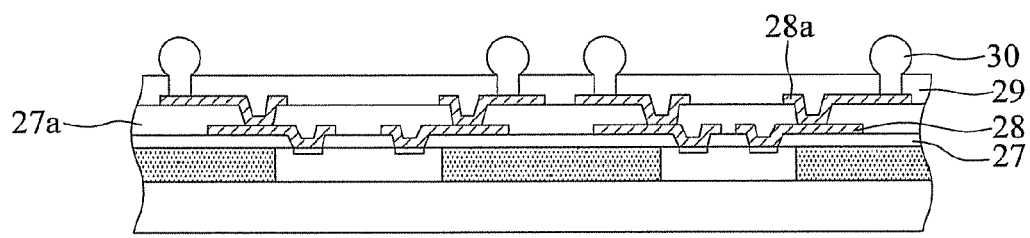

Referring to FIG. 4D, a first solder mask layer 29 is formed on the dielectric layer 27 and the first wiring layer 28, and a plurality of openings is formed in the first solder mask layer 29 to expose a certain portion of the first wiring layer 28. Further, conductive elements 30 can be mounted on the certain portion of the first wiring layer 28 according to practical needs.

Figure 4E:
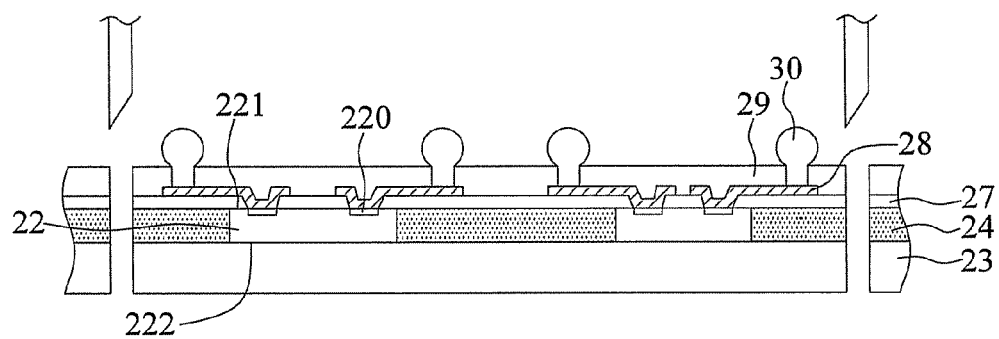
Figure 4E:
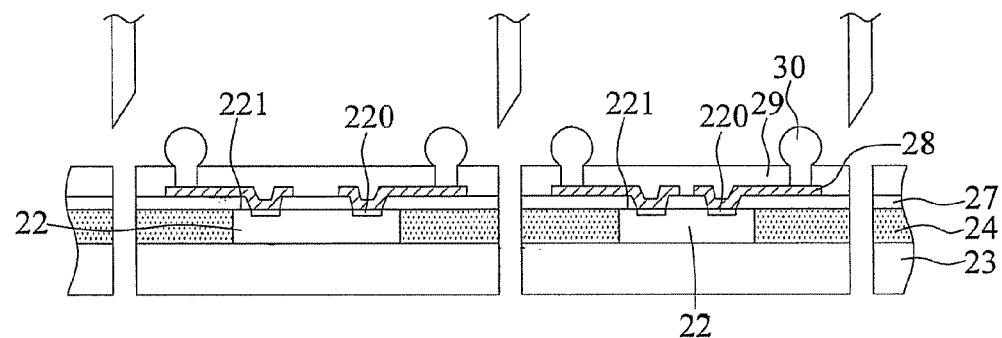

Referring to FIGS. 4E and 4E', a singulation process is performed to obtain a plurality of wafer level chip scale packages (WLCSPs). Such a package can selectively comprise one or more electronic components. Therein, all the electronic components can be chips, or some of them are chips and the others are passive components.

Further referring to FIG. 4D', a build-up structure can be formed on the dielectric layer 27 and the first wiring layer 28 by using the RDL technique. For example, a second dielectric layer 27a and a third wiring layer 28a are formed on the dielectric layer 27 and the first wiring layer 28, and the third wiring layer 28a is electrically connected to the first wiring layer 28. Thereafter, a first solder mask layer 29 is formed on the third wiring layer 28a and a plurality of openings is formed in the first solder mask layer 29 for exposing a certain portion of the third wiring layer 28a. Subsequently, conductive elements 30 are mounted on the certain portion of the third wiring layer 28a so as to function as I/O terminals of the package for electrically connecting to an external device. By increasing the number of build-up layers, the flexibility of wiring layout of the package can be improved.

Through the above-described method, the present invention further discloses a chip scale package, which comprises: at least an electronic component 22 having an active surface 221 with a plurality of electrode pads 220 and an inactive surface 222 opposite to the active surface 221; a soft layer 24 encapsulating the electronic component 22 while exposing the active surface 221 of the electronic component 22; a hard board 23 disposed on the bottom surface of the soft layer 24; a dielectric layer 27 disposed on the active surface 221 of the electronic component 22 and the soft layer 24 and having a plurality of openings for exposing the electrode pads 220; and a first wiring layer 28 disposed on the dielectric layer 27 and electrically connected to the electrode pads 220.

In the chip scale package, the electronic component 22 can be a chip or a passive component.

The chip scale package can further comprise a first solder mask layer 29 disposed on the dielectric layer 27 and the first wiring layer 28 and having a plurality of openings for exposing a certain portion of the first wiring layer 28. The chip scale package can further comprise a build-up structure disposed on the dielectric layer 27 and the first wiring layer 28.

Second Embodiment

Figure 5A:
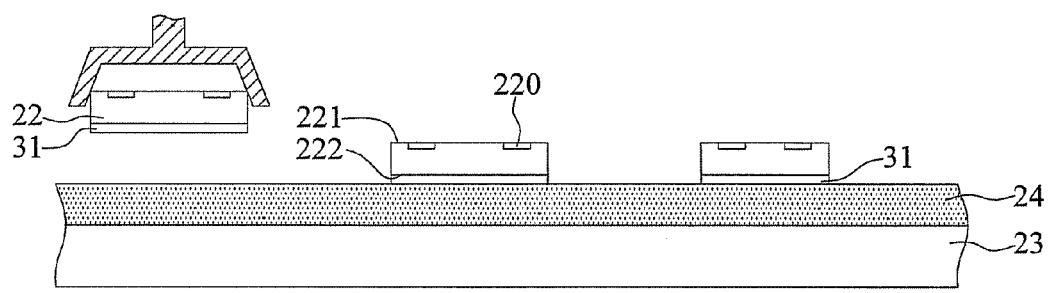
FIGS. 5A and 5B are cross-sectional views showing a chip scale package and a fabrication method thereof according to a second embodiment of the present invention.
Figure 5B:
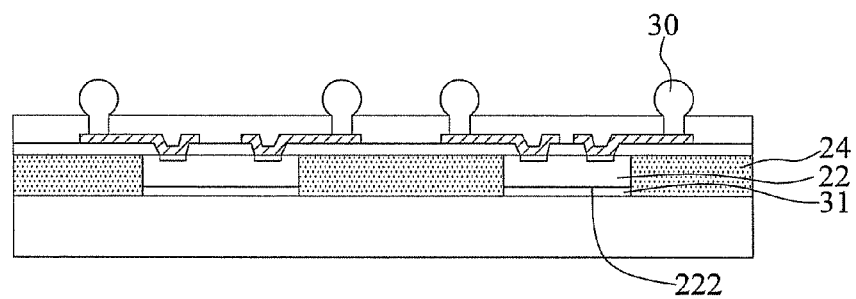

FIGS. 5A and 5B are cross-sectional views showing a chip scale package and a fabrication method thereof according to a second embodiment of the present invention. The present embodiment is similar to the first embodiment. A main difference of the present embodiment from the first embodiment is that a die attach film 31 is disposed on the inactive surface 222 of each of the electronic components 22 and the electronic component 22 is adhered to the soft layer 24 through the die attach film 31.

Third Embodiment

Figure 6:
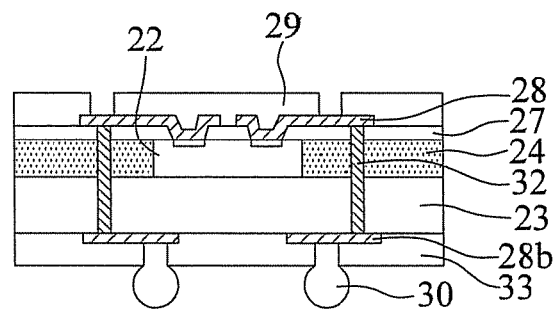
FIG. 6 is a cross-sectional view showing a chip scale package and a fabrication method thereof according to a third embodiment of the present invention.

FIG. 6 is cross-sectional view showing a chip scale package and a fabrication method thereof according to a third embodiment of the present invention. Referring to the drawing, the present embodiment is similar to the above-described embodiments. The difference of the present embodiment from the above-described embodiments is that after the step of pressing the electronic components 22, the step of forming the dielectric layer 27, the step of forming the first wiring layer 28 or the step of forming the first solder mask layer 29, at least a conductive through hole 32 is formed in the hard board 23 and the soft layer 24 for electrically connecting the first wiring layer 28. Then, a second wiring layer 28b is formed on the bottom surface of the hard board 23 and electrically connected to the conductive through hole 32; and a second solder mask layer 33 is formed on the bottom surface of the hard board 23 and the second wiring layer 28b and a plurality of openings is formed in the second solder mask layer 33 for exposing a certain portion of the second wiring layer 28b.

Therefore, the chip scale package further comprises at least a conductive through hole 32 penetrating the hard board 23 and the soft layer 24 for electrically connecting the first wiring layer 28; a second wiring layer 28b disposed on the bottom surface of the hard board 23 and electrically connected to the conductive through hole 32; and a second solder mask layer 33 disposed on the bottom surface of the hard board 23 and the second wiring layer 28b and having a plurality of openings for exposing a certain portion of the second wiring layer 28b. In addition, the chip scale package can comprise a build-up structure formed on the second wiring layer and the second solder mask layer through the above-described method.

Figure 7:
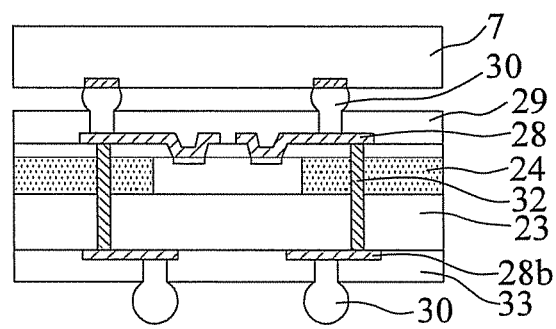
FIG. 7 is a cross-sectional view showing a chip scale package with a semiconductor package stacked thereon according to the present invention.
Figure 8:
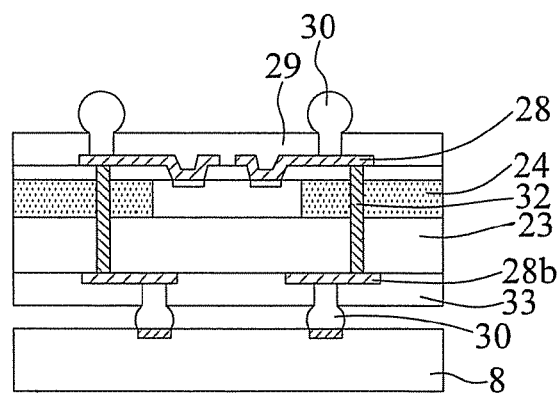
FIG. 8 is a cross-sectional view showing a chip scale package stacked on another semiconductor package according to the present invention.

Further referring to FIGS. 7 and 8, the chip scale package can further comprise a semiconductor package 7 stacked on the certain portion of the first wiring layer 28 through the conductive elements 30, or a semiconductor package 8 stacked on the certain portion of the second wiring layer 28b through the conductive elements 30.

Therefore, the present invention mainly involves providing a hard board with a soft layer so as to encapsulate an electronic component with the soft layer while expose the active surface of the electronic component and then performing an RDL process, thereby eliminating the need of a molding process. The hard board can absorb heat stress in the fabrication process so as to avoid the conventional problems caused by directly attaching the electronic component on an adhesive film as in the prior art, such as film-softening caused by heat, electronic component deviation and contamination that lead to poor electrical connection between the wiring layer in a subsequent RDL process and the electrode pads and even waste product as a result. Further, the present invention eliminates the need of an adhesive film, thereby reducing the fabrication cost and avoiding warpage of the structure. Furthermore, by using a pressing system to make the soft layer encapsulate the electronic component, the electronic component can be secured at position so as not to deviate. In addition, by forming at least a conductive through hole in the hard board and the soft layer, the package can be stacked with other packages.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A fabrication method of a chip scale package, comprising the steps of:
   providing a plurality of electronic components, each having an active surface with a plurality of electrode pads and an inactive surface opposite to the active surface, and a hard board with a soft layer disposed thereon, and adhering the electronic components to the soft layer via the inactive surfaces thereof;
   pressing the electronic components into the soft layer such that the soft layer encapsulates the electronic components while exposing the active surfaces of the electronic components;
   forming a dielectric layer on the active surfaces of the electronic components and the soft layer, and forming a plurality of openings in the dielectric layer for exposing the electrode pads, respectively; and
   forming a first wiring layer on the dielectric layer and electrically connecting the first wiring layer to the electrode pads.

2. The method of claim 1, wherein the electronic components are chips or passive components.

3. The method of claim 1, wherein the electronic components are adhered to the soft layer through a die attach film that is disposed on the inactive surfaces of the electronic components.

4. The method of claim 1, wherein the electronic components are pressed through a pressing system, and the pressing system comprises a base and a press board, and the press board has a back plate disposed on a bottom surface thereof for protecting the electronic components and preventing encapsulant overflow.

5. The method of claim 1, further comprising forming a first solder mask layer on the dielectric layer and the first wiring layer and forming a plurality of openings in the first solder mask layer for exposing a certain portion of the first wiring layer.

6. The method of claim 1, after the step of pressing the electronic components, further comprising forming at least a conductive through hole penetrating the hard board and the soft layer for electrically connecting the first wiring layer.

7. The method of claim 6, further comprising forming a second wiring layer on a bottom surface of the hard board for electrically connecting the second wiring layer to the conductive through hole; and forming a second solder mask layer on the bottom surface of the hard board and the second wiring layer and forming a plurality of openings in the second solder mask layer for exposing a certain portion of the second wiring layer.

8. The method of claim 1, after the step of forming the dielectric layer, further comprising forming at least a conductive through hole penetrating the hard board, the soft layer and the dielectric layer for electrically connecting the first wiring layer.

9. The method of claim 8, further comprising forming a second wiring layer on a bottom surface of the hard board for electrically connecting the second wiring layer to the conductive through hole; and forming a second solder mask layer on the bottom surface of the hard board and the second wiring layer, with a plurality of openings formed in the second solder mask layer for exposing a certain portion of the second wiring layer.

10. The method of claim 1, after the step of forming the first wiring layer, further comprising forming at least a conductive through hole penetrating the hard board, the soft layer and the dielectric layer for electrically connecting the first wiring layer.

11. The method of claim 10, further comprising forming a second wiring layer on bottom surface of the hard board for electrically connecting the second wiring layer to the conductive through hole; and forming a second solder mask layer on the bottom surface of the hard board and the second wiring layer, with a plurality of openings formed in the second solder mask layer for exposing a certain portion of the second wiring layer.

12. A chip scale package, comprising:
   at least an electronic component having an active surface with a plurality of electrode pads formed thereon and an inactive surface opposite to the active surface;
   a soft layer encapsulating the electronic component while exposing the active surface of the electronic component;
   a hard board disposed on a bottom surface of the soft layer;
   a dielectric layer disposed on the active surface of the electronic component and the soft layer and having a plurality of openings for exposing the electrode pads;
   a first wiring layer disposed on the dielectric layer and electrically connected to the electrode pads
   at least a conductive through hole penetrating the hard board, the soft layer and the dielectric layer for electrically connecting the first wiring layer.

13. The package of claim 12, wherein the electronic component is a chip or a passive component.

14. The package of claim 12, wherein the electronic component has a die attach film disposed on the inactive surface thereof.

15. The package of claim 12, further comprising a first solder mask layer disposed on the dielectric layer and the first wiring layer and having a plurality of openings for exposing a certain portion of the first wiring layer.

16. The package of claim 15, further comprising another semiconductor package stacked on said certain portion of the first wiring layer through conductive elements.

17. The package of claim 12, further comprising:
   a second wiring layer formed on a bottom surface of the hard board and electrically connected to the conductive through hole; and
   a second solder mask layer formed on the bottom surface of the hard board and the second wiring layer and having a plurality of openings for exposing a certain portion of the second wiring layer.

18. The package of claim 17, further comprising a build-up structure disposed on the second wiring layer and the second solder mask layer.

19. The package of claim 17, further comprising another semiconductor package stacked on said certain portion of the second wiring layer through conductive elements.

\* \* \* \* \*